United States Patent
Moeggenborg et al.

(10) Patent No.: US 6,589,100 B2
(45) Date of Patent: Jul. 8, 2003

(54) RARE EARTH SALT/OXIDIZER-BASED CMP METHOD

(75) Inventors: Kevin Moeggenborg, Naperville, IL (US); Vlasta Brusic Kaufman, Geneva, IL (US); Isaac K. Cherian, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 09/961,934

(22) Filed: Sep. 24, 2001

(65) Prior Publication Data

US 2003/0060135 A1 Mar. 27, 2003

(51) Int. Cl.$^7$ ................................................. B24B 1/00
(52) U.S. Cl. ...................... 451/41; 451/36; 156/345.12; 438/693
(58) Field of Search ............................ 451/41, 36, 285, 451/63; 438/692, 693; 156/345.11, 345.12

(56) References Cited

U.S. PATENT DOCUMENTS

| 5,114,437 A | 5/1992 | Takeuchi et al. |
| 5,622,525 A | 4/1997 | Haisma et al. |
| 5,759,917 A | 6/1998 | Grover et al. |
| 5,804,513 A | 9/1998 | Sakatani et al. |
| 5,958,288 A | 9/1999 | Mueller et al. |
| 6,110,396 A | 8/2000 | Ronay |
| 6,133,194 A | 10/2000 | Cuif et al. |
| 6,136,693 A | 10/2000 | Chan et al. |
| 6,136,711 A | 10/2000 | Grumbine et al. |
| 6,143,192 A | 11/2000 | Westmoreland |
| 6,217,416 B1 | 4/2001 | Kaufman et al. |
| 6,348,076 B1 * | 2/2002 | Canaperi et al. .............. 451/36 |

FOREIGN PATENT DOCUMENTS

| EP | 0 844 290 | 5/1998 |
| EP | 0 846 740 | 6/1998 |
| EP | 1 036 836 A1 | 9/2000 |
| EP | 1 104 778 A2 | 6/2001 |
| JP | 63 096599 A | 4/1988 |
| JP | 00 167764 A2 | 6/2000 |
| JP | 2001-237389 | 8/2001 |
| WO | WO 98/29515 A1 | 7/1998 |

* cited by examiner

Primary Examiner—Eileen P. Morgan

(57) ABSTRACT

The invention provides a method for polishing a substrate comprising a metal layer using a chemical-mechanical polishing system comprising an abrasive and/or polishing pad, a rare earth salt, an oxidizer that is a stronger oxidant than the rare earth salt, and a liquid carrier.

19 Claims, No Drawings

RARE EARTH SALT/OXIDIZER-BASED CMP METHOD

FIELD OF THE INVENTION

The invention pertains to a method of polishing a metal layer of a substrate using a chemical-mechanical polishing ("CMP") system.

BACKGROUND OF THE INVENTION

Compositions and methods for planarizing or polishing the surface of a substrate are well known in the art. Polishing compositions (i.e., polishing slurries) typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium. Alternatively, the abrasive material may be incorporated in to the polishing pad. U.S. Pat. No. 5,489,233 discloses the use of polishing pads having a surface texture or pattern, and U.S. Pat. No. 5,958,794 discloses a fixed abrasive polishing pad.

Conventional polishing systems and polishing methods typically are not entirely satisfactory at planarizing semiconductor wafers. In particular, polishing slurries and polishing pads can have less than desirable polishing rates, and their use in chemically-mechanically polishing semiconductor surfaces can result in poor surface quality. Because the performance of a semiconductor wafer is directly associated with the planarity of its surface, it is crucial to use a polishing method that has a high polishing efficiency, uniformity, and removal rate and leaves a high quality polish with minimal surface defects.

The difficulty in creating an effective polishing system for semiconductor wafers stems from the complexity of the semiconductor wafer. Semiconductor wafers are typically composed of a substrate, on which a plurality of transistors has been formed. Integrated circuits are chemically and physically connected into a substrate by patterning regions in the substrate and layers on the substrate. To produce an operable semiconductor wafer and to maximize the yield, performance, and reliability of the wafer, it is desirable to polish select surfaces of the wafer without adversely affecting underlying structures or topography. In fact, various problems in semiconductor fabrication can occur if the process steps are not performed on wafer surfaces that are adequately planarized.

There have been many attempts to improve the polishing efficiency and uniformity of conventional polishing agents, while minimizing defectivity of the polished surface and damage to underlying structures or topography. For example, U.S. Pat. No. 5,264,010 describes a polishing composition comprising cerium oxide, fumed silica, and precipitated silica, which purportedly yields an improved removal rate and polishing efficiency. U.S. Pat. No. 5,114,437 describes a polishing composition comprising a carrier, alumina, and a polishing accelerator selected from chromium(III) nitrate, lanthanum nitrate, ammonium cerium nitrate, and neodymium nitrate. U.S. Pat. No. 6,110,396 describes a polishing composition comprising abrasive particles and dual-valent rare earth ions in their higher valent form at acidic pH. U.S. Pat. No. 6,143,192 describes a method of removing ruthenium or ruthenium dioxide using a solution comprising water, ammonium cerium nitrate, and acetic acid. Japanese Laid Open Patent Application 2000167764 describes an improved ruthenium removal rate using slurry comprising ammonium cerium nitrate.

A need remains, however, for polishing systems and polishing methods that will exhibit desirable planarization efficiency, uniformity, and removal rate during the polishing and planarization of substrates, while minimizing defectivity, such as surface imperfections and damage to underlying structures and topography during polishing and planarization. Improved polishing systems are particularly needed for the polishing of noble metal-containing substrates, since noble metals are know to be chemically stable and mechanically hard materials.

The present invention seeks to provide such a chemical-mechanical polishing system and method. These and other advantages of the present invention will be apparent from the description of the invention provided herein.

BRIEF SUMMARY OF THE INVENTION

The invention provides a method of polishing a substrate comprising (i) contacting a substrate comprising at least one metal layer with a chemical-mechanical polishing system comprising an abrasive and/or polishing pad, a rare earth salt, an oxidizer that is a stronger oxidant than the rare earth salt, and a liquid carrier and (ii) abrading at least a portion of the metal layer of the substrate to polish the metal layer.

DETAILED DESCRIPTION OF THE INVENTION

The invention is directed to a method of polishing a metal layer of a substrate using a chemical-mechanical polishing system comprising an abrasive and/or polishing pad, a rare earth salt, an oxidizer that is a stronger oxidant than the rare earth salt, and a carrier. The abrasive (when present and suspended in the liquid carrier), rare earth salt, oxidizer, and liquid carrier, as well as any other components suspended in the liquid carrier, form the polishing composition of the CMP system.

The chemical-mechanical polishing system comprises an abrasive, a polishing pad, or both. Preferably, the CMP system comprises both an abrasive and a polishing pad. The abrasive can be any suitable abrasive. The abrasive can be fixed on the polishing pad and/or can be in particulate form and suspended in the liquid carrier. The polishing pad can be any suitable polishing pad.

The abrasive is any suitable abrasive known in the art. For example, the abrasive particles are natural or synthetic and include diamond (e.g., polycrystalline diamond), garnet, glass, carborundum, metal oxide (e.g., silica, fused alumina, ceramic alumina, chromia, and iron oxide), and the like. The abrasive particles may be coated particle abrasives. The abrasive preferably is a metal oxide abrasive and more preferably is selected from the group consisting of alumina, silica, titania, ceria, zirconia, germania, magnesia, co-formed products thereof, and combinations thereof. Most preferably, the abrasive is alumina.

When the abrasive is present in the CMP system and is suspended in the liquid carrier (i.e., when the abrasive is a component of the polishing composition), any suitable amount of abrasive can be present in the polishing composition. Typically, about 0.1 wt. % or more (e.g., about 0.5 wt. % or more) abrasive will be present in the polishing composition. More typically, about 1 wt. % or more abrasive will be present in the polishing composition. The amount of abrasive in the polishing composition typically will not exceed about 30 wt. %, more typically will not exceed about 20 wt. % (e.g., will not exceed about 10 wt. %).

The rare earth salt can be any salt comprising a rare earth cation (i.e., a lanthanide or actinide metal ion) and a suitable counter-anion. Preferably, the rare earth salt comprises a rare earth (RE) cation, in an oxidation state of $RE^{2+}$, $RE^{3+}$, or $RE^{4+}$, and a counter-anion. The rare earth cation desirably is selected form the group consisting of lanthanum, cerium, praseodymium, neodymium, promethium, samarium, europium, gadolinium, terbium, dysprosium, holmium, erbium, thulium, ytterbium, and lutetium ions, as well as combinations thereof. The counter-anion desirably is selected from the group consisting of sulfate, nitrate, carbonate, hydroxide, fluoride, chloride, bromide, iodide, acetate, perchlorate, oxalate, acetylacetonate, and trifluoromethanesulfonate.

Preferably, the rare earth salt is a cerium or praseodymium salt. More preferably, the rare earth salt is a cerium (II), cerium (III), or cerium (IV) salt. Most preferably, the rare earth salt is cerium (III) acetate.

Any suitable amount of the rare earth salt can be present in the polishing composition. Typically, about $1 \times 10^{-7}$ M or more rare earth salt will be present in the polishing composition. More typically, about $1 \times 10^{-6}$ M or more (e.g., about $1 \times 10^{-5}$ M or more) rare earth salt will be present in the polishing composition. The amount of rare earth salt in the polishing composition typically will not exceed about 0.1 M, more typically will not exceed about 0.05 M (e.g., will not exceed about 0.02 M).

The oxidizer is any suitable oxidizer capable of oxidizing the rare earth salt. Per-type oxidizers are particularly suitable, including inorganic or organic per-compounds. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The per-type oxidizer preferably is hydrogen peroxide. Other suitable oxidizers include bromates, chlorates, chromates, and iodates, with any appropriate countercation, as well as iron salts (e.g., nitrates, sulfates, EDTA, and citrates), potassium ferricyanide, potassium dichromate, iodic acid, and the like.

Any suitable amount of the oxidizer can be present in the polishing composition. Typically, about 0.01 wt. % or more (e.g., about 0.1 wt. % or more) oxidizer will be present in the polishing composition. More typically, about 0.2 wt. % or more (e.g., about 0.5 wt. % or more) oxidizer will be present in the polishing composition. The amount of oxidizer in the polishing composition typically will not exceed about 10 wt. %, more typically will not exceed about 5 wt. % (e.g., will not exceed about 2 wt. %).

The presence of an oxidizer in conjunction with the rare earth salt in the context of the inventive chemical-mechanical polishing system appears to exhibit a synergistic effect, which improves the polishing rate of the substrate.

While not wishing to be bound to this theory, it is believed that the rare earth ion acts as a catalyst in the reaction of the oxidizer with the metal surface. For example, the surface of the substrate can be oxidized by a Ce(IV) compound which in turn is reduced to Ce(III). The oxidizer, for example, hydrogen peroxide, then re-oxidizes the Ce(III) ion to Ce(IV) resulting in a higher percentage of Ce(IV) overall during the polishing process. The proposed mechanism is supported by the fact that, for example, Ce(III) acetate, although itself not an oxidizer, is equally effective in the removal of metal from a substrate as a cerium(IV) salt when used in combination with an oxidizer. The choice of rare earth salt and oxidizer should be such that the oxidizer is a stronger oxidant than the rare earth salt, i.e., an oxidizer that is capable of spontaneously oxidizing the rare earth salt under the conditions of the chemical-mechanical polishing system. Such oxidizers will have an oxidation potential greater in magnitude that the oxidation potential of the rare earth salt.

A liquid carrier is used to facilitate the application of the abrasive (when present), rare earth salt, and oxidizer to the surface of a suitable substrate to be polished or planarized. The liquid carrier can be any suitable liquid carrier. Preferably, the liquid carrier comprises, consists essentially of, or consists of water, more preferably deionized water.

The chemical-mechanical polishing system optionally further comprises one or more solutes, for example, acetic acid or other liquid or solid solutes. Such solutes desirably act as agents for buffering or enhancing dissolution of the rare earth salt in the liquid carrier. Such solutes can be present in the polishing composition in any suitable amount (e.g., 0.1–5 wt. %).

The chemical-mechanical polishing system also optionally further comprises an amine-containing polymer or copolymer, for example, polyethylenimine, polyetheramine, polydiallyldimethylammonium chloride (polydadmac), and mixtures thereof. Such polymers and copolymers can be present in the polishing composition in any suitable amount (e.g., 0.1–5 wt. %).

The chemical-mechanical polishing system preferably comprises about 1–10 wt. % carrier-suspended abrasive particles, about $1 \times 10^{-7}$ M–0.05 M rare earth salt, about 0.1–5 wt. % oxidizer, and water. In a more preferred embodiment, the CMP system comprises alumina particles, cerium acetate, hydrogen peroxide, and water.

The chemical-mechanical polishing system desirably is used in a method of polishing a substrate comprising at least one metal layer, whereby the substrate is contacted with the chemical-mechanical polishing system and at least a portion of the metal layer of the substrate is abraded such that the metal layer becomes polished. The substrate can be any suitable substrate (e.g., an integrated circuit, rigid memory disk, or magnetic head) and can contain any suitable metal or metal alloy (e.g., metal conductive layer). The CMP system is particularly well suited for polishing noble metal-containing substrates, especially those used in the electronics industry. The substrate preferably comprises a noble metal selected from the group consisting of rhenium, ruthenium, rhodium, palladium, silver, osmium, iridium, platinum, and gold. In a more preferred embodiment, the noble metal is ruthenium.

The following examples further illustrate the invention but, of course, should not be construed as in any way limiting its scope.

EXAMPLE 1

This example illustrates the synergistic effect on polishing rate resulting from the combination of an oxidizer with an oxidizing rare earth salt in a chemical-mechanical polishing system used to polish a metal-containing substrate.

Similar substrates comprising a ruthenium layer were polished with two different chemical-mechanical polishing systems, each of which comprised the same polishing pad in conjunction with a different polishing composition (Polishing Compositions 1A and 1B). Polishing Composition 1A (control) comprised 8 wt. % alumina, 0.0182 M ammonium cerium(IV) nitrate, 1 wt. % acetic acid, and water (pH=5), with no oxidizer. Polishing Composition 1B (invention) was the same as Polishing Composition 1A (control), except that it also comprised 1 wt. % hydrogen peroxide. The polishing process with these two chemical-mechanical polishing systems was carried out using a downforce pressure exerted on the substrate against the polishing pad of 20.7 kPa (3 psi). The removal rate for the ruthenium layer of the substrates was measured for each of the chemical-mechanical polishing systems.

With respect to the chemical-mechanical polishing system utilizing Polishing Composition 1A (control), the ruthenium removal rate was determined to be 98.54 nm/min with 5.8% within-wafer-non-uniformity (WIWNU). The WIWNU is a percentage calculated by dividing the standard deviation of removal rate by the average removal rate over the substrate and multiplying by 100. With respect to the chemical-mechanical polishing system utilizing Polishing Composition 1B (invention), the ruthenium removal rate was determined to be 210.98 nm/min with 5.1% WIWNU. Thus, the removal rate was more than doubled by the presence of both the rare earth salt and the oxidizer, as compared to the presence of only the rare earth salt.

This example demonstrates that polishing effectiveness is dramatically improved through use of the inventive chemical-mechanical polishing system in the polishing of a substrate containing a metal layer, particularly a noble metal layer. Notably, the substantially higher polishing rate observed in connection with the inventive chemical-mechanical polishing system as compared to the control chemical-mechanical polishing system was not accompanied by a decrease in polishing uniformity of the substrate surface.

EXAMPLE 2

This example illustrates the synergistic effect on polishing rate resulting from the combination of an oxidizer with a non-oxidizing rare earth salt in a chemical-mechanical polishing system used to polish a metal-containing substrate.

Similar substrates comprising a ruthenium layer were polished with six different chemical-mechanical polishing systems, each of which comprised the same polishing pad in conjunction with a different polishing composition (Polishing Compositions 2A–2F). Polishing Composition 2A (control) comprised 8 wt. % alumina, 0.0315 M cerium (IIII) acetate, and water (pH=5), with no oxidizer. Polishing Composition 2B (control) comprised 8 wt. % alumina, 1 wt. % hydrogen peroxide, and water (pH=5), with no rare earth salt. Polishing Composition 2C (invention) was the same as Polishing Compositions 2A and 2B (control), except that it comprised both 0.0315 M cerium (III) acetate and 1 wt. % hydrogen peroxide. Polishing Compositions 2D, 2E, and 2F (invention) were the same as Polishing Composition 2C (invention), except that they comprised different amounts of the rare earth salt, specifically, $3.15 \times 10^{-4}$ M, $3.15 \times 10^{-5}$ M, and $3.15 \times 10^{-6}$ M cerium (III) acetate, respectively (in addition to 1 wt. % hydrogen peroxide). The polishing process with these six chemical-mechanical polishing systems was carried out using a downforce pressure exerted on the substrate against the polishing pad of 20.7 kPa (3 psi). The removal rate for the ruthenium layer of the substrates was measured for each of the chemical-mechanical polishing systems.

With respect to the chemical-mechanical polishing system utilizing Polishing Compositions 2A and 2B (control), the ruthenium removal rates were determined to be 7.0 nm/min and less than 5 nm/min, respectively. With respect to the chemical-mechanical polishing systems utilizing Polishing Composition 2C, 2D, 2E, and 2F (invention), the ruthenium removal rates were determined to be 224.6 nm/min with 4.4% WIWNU, 325.1 nm/min, 230.4 nm/min, and 177.3 nm/min, respectively. Thus, the removal rate was more than ten times (and in some instances more than 30 times) greater in the presence of both the rare earth salt and the oxidizer than in the presence of only the rare earth salt or only the oxidizer. In addition, the removal rate remained relatively high (and substantially higher than the controls) even with significantly lower levels of the rare earth salt (compare removal rates observed with Polishing Compositions 2D, 2E, and 2F with the removal rate observed with Polishing Composition 2C as well as the removal rates observed with Polishing Compositions 2A and 2B).

This example further demonstrates that polishing effectiveness is dramatically improved through use of the inventive chemical-mechanical polishing system in the polishing of a substrate containing a metal layer, particularly a noble metal layer. Considered together with Example 1, this example lends support to the role of the oxidizer in the conversion of a non-oxidizing form of rare earth ion to an oxidizing form that is effective in the chemical-mechanical polishing of the surface of a substrate. Moreover, this example illustrates that good removal rates for a substrate layer can be obtained even when only very small amounts of the rare earth salt are used in combination with a oxidizer. This finding is significant given the relatively high cost of rare earth metal salts.

EXAMPLE 3

This example illustrates that the synergistic effect on polishing rate resulting from the combination of an oxidizer with a rare earth salt is not substantially dependent on the identity of the counter-anion of the rare earth salt in a chemical-mechanical polishing system used to polish a metal-containing substrate.

Similar substrates comprising a ruthenium layer were polished with four different chemical-mechanical polishing systems, each of which comprised the same polishing pad in conjunction with a different polishing composition (Polishing Compositions 3A–3D). Polishing Composition 3A (invention) comprised 8 wt. % alumina, $3.15 \times 10^{-6}$ M (1 ppm) cerium (III) acetate, 1 wt. % hydrogen peroxide, and water (pH=5). Polishing Compositions 3B, 3C, and 3D (invention) were the same as Polishing Composition 3A (invention), except that the rare earth ions had different counterions, specifically, $5.03 \times 10^{-6}$ M (1.67 ppm) cerium (III) sulfate, $2.97 \times 10^{-6}$ M (1.29 ppm) cerium (III) nitrate, and $2.93 \times 10^{-6}$ M (1.35 ppm) cerium (III) carbonate, respectively (in addition to 1 wt. % hydrogen peroxide). The amount of cerium (III) ion was about 0.4 ppm in Polishing Compositions 3A–3D. The polishing process with these four chemical-mechanical polishing systems was carried out using a downforce pressure exerted on the substrate against the polishing pad of 34.5 kPa (5 psi). The removal rate for the ruthenium layer of the substrates was measured for each of the chemical-mechanical polishing systems.

The ruthenium removal rates resulting from the use of each of the four chemical-mechanical polishing systems, i.e., utilizing Polishing Composition 3A, 3B, 3C, and 3D (invention), were determined to be 48.9 nm/min, 46.0 nm/min, 36.0 nm/min, and 28.2 nm/min, respectively. Thus, the ruthenium removal rate remains high (>25 nm/min) regardless of the identity of the counter-anion used.

This example demonstrates that the invention can be practiced with rare earth salts having a variety of counter-anions in combination with oxidizers.

EXAMPLE 4

This example further illustrates the synergistic effect on polishing rate resulting from the combination of an oxidizer with a rare earth salt in a chemical-mechanical polishing system used to polish a metal-containing substrate.

A substrate comprising a ruthenium layer was polished in the same manner and under the same conditions as in Example 3 with a chemical-mechanical polishing system comprising the same polishing pad as in Example 3 but a somewhat different polishing composition (Polishing Composition 4). Specifically, Polishing Composition 4 was the same as Polishing Compositions 3A–3D of Example 2, except that the rare earth salt component of the polishing composition was $3.14 \times 10^{-6}$ M (1 ppm) praseodymium (III) acetate (about 0.4 ppm praseodymium (III) ion). The removal rate for the ruthenium layer of the substrate was measured for the chemical-mechanical polishing system utilizing Polishing Composition 4 and was determined to be 26.7 nm/min.

This example, considered with Example 3, demonstrates that the synergistic effect of a rare earth salt with an oxidizer in a chemical-mechanical polishing system in the polishing of a substrate containing a metal layer, particularly a noble metal layer, extends to a variety of rare earth cations of the rare earth salt.

EXAMPLE 5

This example further illustrates the synergistic effect on polishing rate resulting from the combination of an oxidizer with a rare earth salt in a chemical-mechanical polishing system used to polish a metal-containing substrate.

Similar substrates comprising an iridium layer were polished with five different chemical-mechanical polishing systems, each of which comprised the same polishing pad in conjunction with a different polishing composition (Polishing Compositions 5A–5E). Polishing Composition 5A (control) comprised 8 wt. % alumina, 0.0315 M cerium (IIII) acetate, and water (pH=5), with no oxidizer. Polishing Compositions 5B and 5C (invention) were identical to each other, and Polishing Compositions 5D and 5E (invention) were identical to each other. In particular, Polishing Compositions 5B and 5C (invention) were the same as Polishing Composition 5A (control), except that they also comprised 1 wt. % hydrogen peroxide. Polishing Compositions 5D and 5E (invention) were the same as Polishing Composition 5B and 5C (invention), except that they comprised different amounts of the rare earth salt, specifically, $3.15 \times 10^{-6}$ M cerium (III) acetate (in addition to 1 wt. % hydrogen peroxide). The polishing process with these five chemical-mechanical polishing systems was carried out using different downforce pressures exerted on the substrate against the polishing pad of either 20.7 kPa (3 psi) for Polishing Compositions 5A, 5B, and 5D, or 34.5 kPa (5 psi) for Polishing Compositions 5C and 5E. The removal rate for the iridium layer of the substrates was measured for each of the chemical-mechanical polishing systems.

With respect to the chemical-mechanical polishing system utilizing Polishing Composition 5A (control), the iridium removal rate was determined to be less than 2.0 nm/min. With respect to the chemical-mechanical polishing systems utilizing Polishing Composition 5B, 5C, 5D, and 5E (invention), the iridium removal rates were determined to be 16.7 nm/min, 29.1 nm/min, 23.2 nm/min, and 33.0 nm/min, respectively. Thus, the removal rate was substantially greater in the presence of both the rare earth salt and the oxidizer than in the presence of only the rare earth salt. In addition, the removal rate remained relatively high (and substantially higher than the control) even with significantly lower levels of the rare earth salt (compare the removal rates observed as between Polishing Compositions 5B and 5D, as well as the removal rates observed as between Polishing Compositions 5C and 5E).

This example demonstrates that the synergistic effect of a rare earth salt with a oxidizer in a chemical-mechanical polishing system is observed in polishing relatively hard noble metal layers such as iridium layers. Moreover, this example illustrates that good removal rates of a substrate layer can be obtained even when only very small amounts of the rare earth salt are used in combination with an oxidizer. This finding is significant given the high cost of rare earth metal salts.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a substrate comprising:
   (i) contacting a substrate comprising at least one noble metal layer with a chemical-mechanical polishing system comprising:

(a) an abrasive and/or polishing pad,
(b) a rare earth salt,
(c) an oxidizer that is a stronger oxidant than the rare earth salt, and
(d) a liquid carrier, and
(ii) abrading at least a portion of the noble metal layer of the substrate to polish the noble metal layer,
wherein the noble metal is selected from the group consisting of rhenium, ruthenium, rhodium, palladium, silver, osmium, iridium, platinum, and gold.

2. The method of claim 1, wherein the chemical-mechanical polishing system comprises an abrasive, and the abrasive is a metal oxide.

3. The method of claim 2, wherein the abrasive is selected from the group consisting of alumina, silica, titania, ceria, zirconia, germania, magnesia, co-formed products thereof, and combinations thereof.

4. The method of claim 3, wherein the abrasive is alumina.

5. The method of claim 1, wherein the chemical-mechanical polishing system comprises an abrasive, and the abrasive is fixed on the polishing pad.

6. The method of claim 1, wherein the chemical-mechanical polishing system comprises an abrasive, and the abrasive is in particulate form and is suspended in the carrier.

7. The method of claim 1, wherein the rare earth salt comprises cerium, praseodymium, or combinations thereof.

8. The method of claim 7, wherein the rare earth salt comprises a rare earth (RE) cation, in an oxidation state of $RE^{2+}$, $RE^{3+}$, or $RE^{4+}$, and a counter-anion selected from the group consisting of sulfate, nitrate, carbonate, hydroxide, fluoride, chloride, bromide, iodide, acetate, perchlorate, oxalate, acetylacetonate and trifluoromethanesulfonate.

9. The method of claim 8, wherein the rare earth salt comprises a cerium (II), cerium (III), or cerium (IV) ion.

10. The method of claim 8, wherein the rare earth salt is cerium acetate.

11. The method of claim 1, wherein the oxidizer is a per-type oxidizer.

12. The method of claim 11, wherein the per-type oxidizer is hydrogen peroxide.

13. The method of claim 1, wherein the liquid carrier is water.

14. The method of claim 1, wherein the system further comprises acetic acid.

15. The method of claim 1, wherein the system further comprises an amine-containing polymer or copolymer.

16. The method of claim 1, wherein the system comprises about 1–10 wt. % carrier-suspended abrasive particles, about $1 \times 10^{-7}$–0.05 M rare earth salt, about 0.1–5 wt. % oxidizer, and water.

17. The method of claim 16, wherein the abrasive particles are alumina particles, the rare earth salt is cerium acetate, and the oxidizer is hydrogen peroxide.

18. The method of claim 1, wherein the noble metal is selected from the group consisting of rhenium, ruthenium, rhodium, iridium, and platinum.

19. The method of claim 18, wherein the noble metal is ruthenium.

* * * * *